United States Patent
Lustig

(10) Patent No.: US 6,171,937 B1
(45) Date of Patent: Jan. 9, 2001

(54) PROCESS FOR PRODUCING AN MOS TRANSISTOR

(75) Inventor: Bernhard Lustig, München (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/091,150
(22) PCT Filed: Nov. 21, 1996
(86) PCT No.: PCT/DE96/02235
§ 371 Date: Jun. 9, 1998
§ 102(e) Date: Jun. 9, 1998
(87) PCT Pub. No.: WO97/23902
PCT Pub. Date: Jul. 3, 1997

(30) Foreign Application Priority Data

Dec. 21, 1995 (DE) .............................. 195 48 058

(51) Int. Cl.$^7$ ............................. H01L 21/3205
(52) U.S. Cl. ........................... 438/585; 438/182
(58) Field of Search .................. 438/182, 286, 438/300, 303, 304, 305, 446, 574, 579, 585, 595, 596

(56) References Cited

U.S. PATENT DOCUMENTS

| 4,354,896 | | 10/1982 | Hunter et al. | 438/696 |
|---|---|---|---|---|
| 4,358,340 | * | 11/1982 | Fu | 438/585 |
| 4,432,132 | * | 2/1984 | Kinsbron et al. | 438/303 |
| 4,689,869 | * | 9/1987 | Jambotkar et al. | 438/285 |
| 4,851,365 | * | 7/1989 | Jeuch | 438/257 |
| 5,202,272 | * | 4/1993 | Hsieh et al. | 438/301 |
| 5,231,038 | | 7/1993 | Yamaguchi et al. | 438/303 |
| 5,599,738 | * | 2/1997 | Hashemi et al. | 438/570 |
| 5,705,414 | * | 1/1998 | Lustig | 438/585 |
| 5,893,735 | * | 4/1999 | Stengl et al. | 438/243 |

FOREIGN PATENT DOCUMENTS

| 42 34 777 A1 | 4/1994 | (DE) . |
|---|---|---|
| 195 27 131 A1 | 2/1996 | (DE) . |
| 0 480 313 A2 | 4/1992 | (EP) . |

OTHER PUBLICATIONS

Symposium on VLSI Technology Digest of Technical Papers, 3A–1, (1995), Q. F. Wang et al, "New CoSi$^2$ SALICIDE Technology for 0.1μm Processes and Below," pp. 17–18.

IBM Technical Disclosure Bulletin, vol. 33, No. 1A, (Jun. 1990), "Low Series Resistance Source By Spacer Methods," pp. 75–77.

IEEE Electron Device Letters, vol 12, No. 1, (Jan. 1991), A. E. Schmitz et al, "A Deep–Submicrometer Microwave/Digital CMOS/SOS Technology," pp. 16–17.

* cited by examiner

Primary Examiner—Carl Whitehead, Jr.
Assistant Examiner—Jeff Vockrodt
(74) Attorney, Agent, or Firm—Schiff Hardin & Waite

(57) ABSTRACT

A MOS transistor has a gate electrode (33) having a T-shaped cross-section. The gate length is defined in a first structuring step by a spacer technique. The area of the gate electrode in the upper region is defined in a second structuring step. The MOS transistor can be produced with a channel length of less than 100 nm.

10 Claims, 7 Drawing Sheets

PROCESS FOR PRODUCING AN MOS TRANSISTOR

BACKGROUND OF THE INVENTION

With regard to fast circuits, there is increasing interest directed towards silicon or silicon-germanium MOSFETs having a short channel length. Switching times in the region of 10 ps can be achieved with silicon short-channel MOS transistors having channel lengths of less than 100 nm. The channel length is in this case given by the dimension of the gate electrode minus gate-source and gate-drain overlap.

IBM TDB Volume 33, June 1990, pages 75 to 77 discloses structuring the gate electrode for a short-channel transistor using a spacer as an etching mask.

Furthermore, it is known (see, for example, U.S. Pat. No. 5 231 038 and German Reference DE 42 34 777 A1) to reduce the structure size, which determines the channel length, of the gate electrode at the surface of the channel by producing the gate electrode with a T-shaped cross-section. For this purpose, insulating spacers are formed on flanks, which face the channel region, of connections of the source/drain regions, above which spacers the gate electrode is formed. The gate electrode laterally overlaps the insulating spacers in the upper region. As an alternative (see German Reference DE 42 34 777 A1), the gate electrode is formed from two different metal layers. Following the structuring of the upper metal layer, the lower metal layer is etched back below the lateral dimensions of the upper metal layer.

At switching speeds of this type, the RC constants of the gate electrodes are no longer negligible. In addition, the resistance of the gate electrode, which is usually composed of polysilicon, which is doped and possibly silicide-treated or coated with other materials of better conductivity, rises with shorter edge length, which is attributed, for example, to grain boundary influences.

SUMMARY OF THE INVENTION

The invention is based on the problem of specifying a method for the production of a MOS transistor having a short channel length.

In general terms the present invention is a method for the production of an MOS transistor. A source region, a drain region and a channel region arranged in between are produced in a substrate, which comprises silicon at least in the region of a main area. A gate dielectric, which covers at least the surface of the channel region, is produced on the main area. A first electrode layer is produced over the whole area. Auxiliary structures having flanks which are aligned essentially perpendicular to the main area are produced on the first electrode layer. Spacers are formed on the flanks of the auxiliary structures. The first electrode layer is structured in accordance with the spacers, electrode webs being produced. A planarizing layer is formed such that the electrode webs are exposed in the upper region, whereas the interspaces between neighboring electrode webs are filled by the planarizing layer. A second electrode layer is produced over the whole area. By structuring the second electrode layer, a gate electrode is formed from a part of one of the electrode webs and a part of the second electrode layer.

Advantageous developments of the present invention are as follows.

An auxiliary layer is applied to the first electrode layer in order to form the auxiliary structures. The auxiliary layer is structured by anisotropic etching such that the first electrode layer remains covered by the auxiliary layer and that depressions having essentially vertical flanks are formed in the auxiliary layer.

The spacers on the flanks of the auxiliary structures are formed by the deposition and anisotropic etching of a layer with essentially conformal edge covering. A hard mask is formed by anisotropic etching of the auxiliary layer, using the spacers as an etching mask. The electrode webs are formed by anisotropic etching of the first electrode layer, using the hard mask as an etching mask.

An insulating layer is deposited in order to form the planarizing layer, the thickness of which insulating layer is at least as large as half the distance between neighboring electrode webs. The insulating layer is removed by a planarization method until the electrode webs are exposed in the upper region. An LDD implantation is carried out following the formation of the electrode webs. The second electrode layer is structured using a lithographically produced mask.

The planarizing layer is formed such that the upper region of the electrode webs distinctly projects beyond the planarizing layer. A mask is produced which covers that part of the electrode webs which are provided as part of the gate electrode. Those parts of the electrode webs which are not covered by the mask are etched back and the mask is removed. Anisotropic etching is carried out following the formation of the second electrode layer, during which anisotropic etching those parts of the electrode webs which are not covered by the mask are removed. Following the formation of the gate electrode, the planarizing layer is structured by anisotropic etching, the gate electrode acting as a mask. An implantation is carried out in order to form the source region and the drain region, the gate electrode acting as a mask. The gate electrode and also the source region and drain region are provided with a layer made of metal silicide. The first electrode layer and the second electrode layer and also the spacers made of doped polysilicon, the auxiliary structures and the planarizing layer are formed from $SiO_2$.

The MOS transistor produced according to the invention has a gate electrode having a T-shaped cross-section. The gate electrode has smaller structure sizes in the lower region, at the surface interfacing with the gate dielectric, than in the upper region. The upper region of the gate electrode, which is remote from the gate dielectric, determines the line resistance of the gate electrode. The lower region of the gate electrode at the interface with the gate dielectric, on the other hand, determines the channel length, which is decisive for the switching speed of the MOS transistor. Since the structure sizes of the gate electrode in the MOS transistor according to the invention have different magnitudes at the surface interfacing with the gate dielectric and at the opposite surface, which determines the line resistance of the gate electrode, the channel length is set independently of the contact resistance of the gate electrode.

The MOS transistor produced according to the invention can be used particularly advantageously with channel lengths of less than 100 nm, since in this range the resistance of a polysilicon-containing gate electrode rises more markedly, owing to the increasing influence of grain boundaries, than would correspond to the reduction in the surface area.

A further advantage of the MOS transistor produced according to the invention resides in the fact that even with channel lengths of less than 100 nm, it is possible to realize the gate electrode with structure sizes of $\geq 250$ nm, for example, in the upper region. This enables a further reduction in the resistance of the gate electrode to be achieved by applying metal silicide, for example titanium silicide. It has been shown that, with structure sizes of less than 250 nm, titanium silicide increasingly has a phase of high resistance and is not well suited for resistance reduction with such small structures.

The gate electrode of the MOS transistor is preferably produced from two electrode layers in two independent structuring steps. In this case, a first electrode layer is first of all structured with the aid of a spacer technique in such a way that it determines the channel length of the MOS transistor. As an alternative, the first electrode layer can also be structured by means of a different fine-structuring technique, for example with the aid of electron beam lithography. A planarizing layer is subsequently formed in such a way that the structured, first electrode layer is exposed in the upper region. Outside the structured, first electrode layer, the surface of the gate dielectric is covered by the planarizing layer. A second electrode layer is subsequently deposited and structured. The structure sizes are larger here than in the case of the first structured electrode layer.

The second electrode layer can be structured both using a photoresist mask and in a self-aligning manner.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
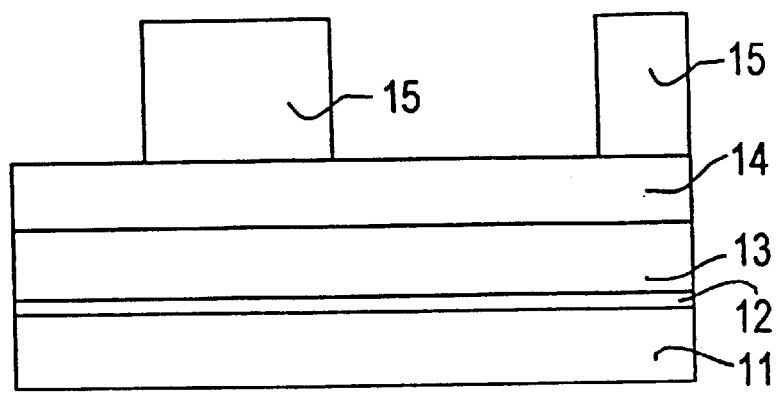
FIG. 1 shows a substrate with a gate dielectric, a first electrode layer, an auxiliary layer and a photoresist mask.

A gate dielectric 12 is applied to a substrate 11, which comprises silicon at least in the region of a main area, for example a monocrystalline silicon structure or an SOI substrate (see FIG. 1). The gate dielectric 12 is formed, for example by thermal oxidation, from $SiO_2$ to a layer thickness of 3 to 4 nm.

A first electrode layer 13 is applied to the gate dielectric 12. The first electrode layer 13 is produced, for example, from doped polysilicon to a layer thickness of, for example, 200 nm.

An auxiliary layer 14 made of $SiO_2$ is formed onto the first electrode layer 13, for example by deposition using a TEOS method. The auxiliary layer 14 has a thickness of, for example, 200 nm. A photoresist mask 15 is formed on the auxiliary layer 14.

Figure 2:
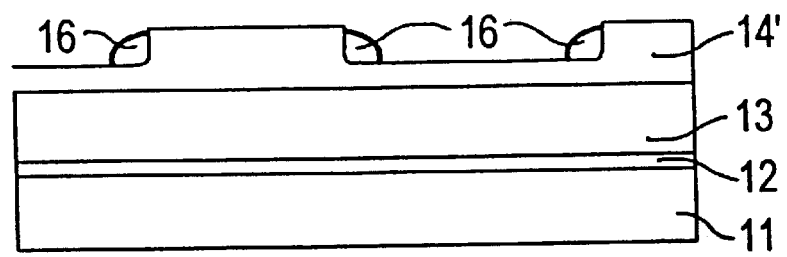
FIG. 2 shows the substrate following the formation of an auxiliary structure and the formation of spacers on flanks of the auxiliary structure.

An auxiliary structure 14' is formed from the auxiliary layer 14 by means of anisotropic etching, for example, using, for example, $CHF_3$ RIE (Reactive Ion Etching). The auxiliary structure 14' has essentially vertical flanks. The auxiliary structure 14' completely covers the surface of the first electrode layer 13 (see FIG. 2). The auxiliary structure 14' preferably has regularly arranged elevations.

Polysilicon spacers 16 are formed on the flanks of the auxiliary structure 14' by depositing a layer with essentially conformal edge covering and anisotropically etching it back using, for example, HBr RIE (Reactive Ion Etching). The layer is in this case deposited to a thickness of, for example, 100 nm. Consequently, the width of the spacers 16 is, for example, likewise 100 nm. The arrangement of the spacers 16 is predetermined by the arrangement of the flanks of the auxiliary structure 14'.

Figure 3:
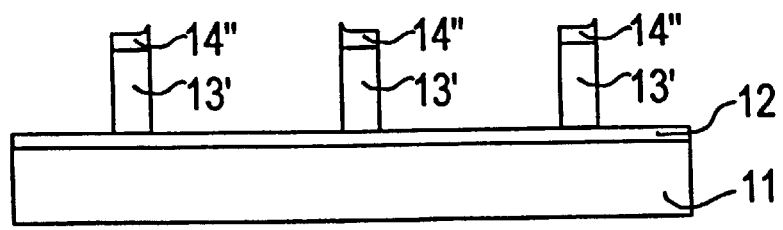
FIG. 3 shows the substrate following the structuring of the first electrode layer to form electrode webs.

Using the spacers 16 as an etching mask, the auxiliary layer 14' is structured by means of anisotropic etching, for example, using $CHF_3$ and $CF_4$ RIE (reactive Ison Etching). This produces a hard mask 14" (see FIG. 3).

Anisotropic etching using, for example, HBr is carried out, electrode webs 13' being formed from the first electrode layer 13 in the process. The spacers 16, which are likewise composed of polysilicon, are simultaneously removed during this etching process. The hard mask 14", on the other hand, is not attacked during this etching process and ensures that the structure is transferred to the electrode webs 13' with accurate edges.

Figure 4:
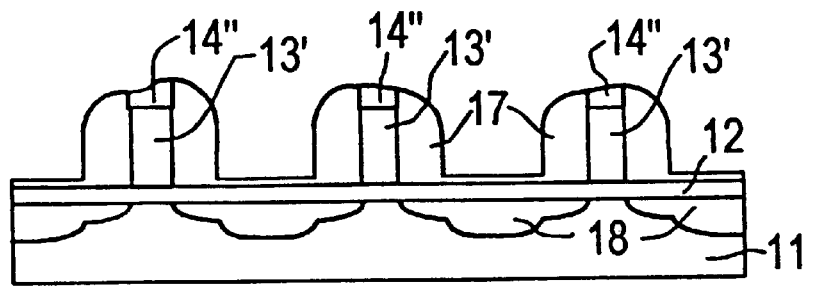
FIG. 4 shows the substrate following the formation of source/drain regions.

Subsequently, if appropriate, the flanks of the electrode webs 13' are provided with thin $SiO_2$ spacers and an LDD (lightly doped drain) implantation is carried out. This is carried out, for example, using arsenic at an implantation energy of 20 keV and a dose of $5 \times 10^{14}$ $cm^{-2}$. The LDD regions can also be doped by out-diffusion from doped spacers. Thick $SiO_2$ spacers 17 are subsequently produced on the flanks of the electrode webs 13' and an HDD implantation is carried out in order to form source/drain regions 18 (see FIG. 4). The HDD (heavily doped drain) implantation is carried out, for example, using arsenic at an energy of 90 keV and a dose of $5\times10^{15}$ $cm^{-2}$.

Figure 5:
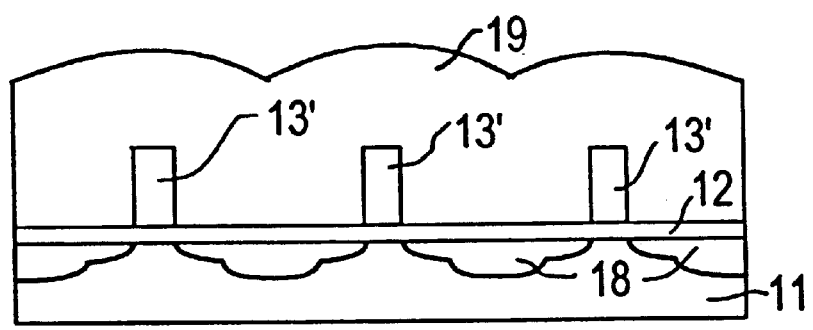
FIG. 5 shows the substrate following the deposition of an $SiO_2$ layer, which fills the interspaces between neighbouring electrode webs.

An $SiO_2$ layer is deposited over the whole area, for example BPSG (boron phosphorus silicate glass), which covers the electrode webs 13' and fills the interspaces between neighbouring electrode webs 13'. The reference symbol 19 designates the $SiO_2$ layer, the thick $SiO_2$ spacers 17, the thin $SiO_2$ spacers and the hard mask 14" (see FIG. 5). The $SiO_2$ layer is deposited to a thickness of, for example, 300 nm.

Figure 6:
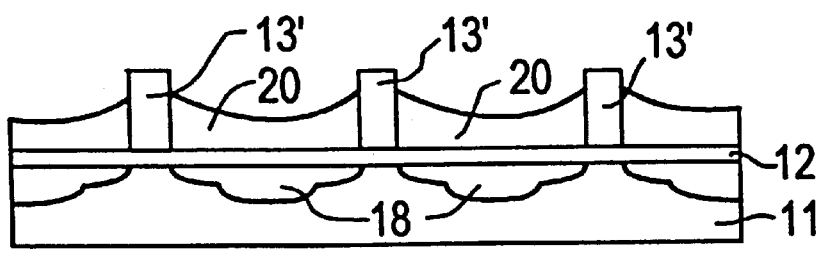
FIG. 6 shows the substrate following the planarization of the $SiO_2$ layer.

In a planarization step, for example by means of chemical mechanical polishing, and/or planarization etching or the like, the $SiO_2$ layer 19 is etched back until its thickness is less than the height of the electrode webs 13'. The electrode webs 13' are exposed in the upper region in the process (see FIG. 6). Between neighbouring electrode webs 13', however, the surface of the gate dielectric 12 remains covered by the planarizing layer 20. With regard to the formation of the planarizing layer 20, it is advantageous if the electrode webs 13' are arranged regularly. The arrangement of the electrode webs 13' is predetermined by the auxiliary structure 14'.

Figure 7:
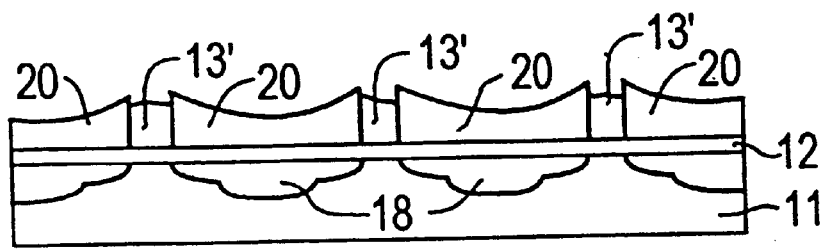
FIG. 7 shows the substrate following the etching back of the electrode webs.

The electrode webs 13' are subsequently etched back, for example wet-chemically using choline, down to the level of the planarizing layer 20 (see FIG. 7). This is carried out, for example, by 100 nm, in order to be able to deposit the second electrode layer in a manner which is as planar as possible.

Figure 8:
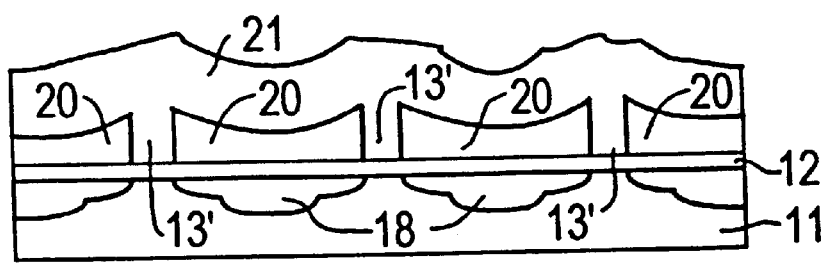
FIG. 8 shows the substrate following the deposition of a second electrode layer.

A second electrode layer 21 is subsequently deposited over the whole area. The second electrode layer 21 is deposited, for example, from doped polysilicon to a layer thickness of, for example, 200 nm (see FIG. 8). The second electrode layer 21 is joined to the electrode webs 13'.

Figure 9:
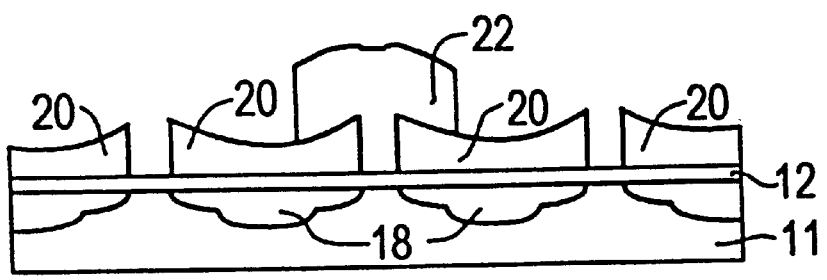
FIG. 9 shows the substrate following the production of a T-shaped gate electrode.

A mask is produced (not illustrated) which defines the shape of a gate electrode 22 in the upper region. The second electrode layer 21 outside the mask and the electrode webs 13' outside the mask are removed by means of anisotropic etching, for example, using HBr. The etching stops on the surface of the planarizing layer 20 or, in the region of the electrode webs 13', on the surface of the gate dielectric 12. This produces the gate electrode 22, which comprises a part of the electrode webs 13' and a part of the second electrode layer 21 (see FIG. 9). The structure size of the gate electrode 22 at the surface of the gate dielectric 12 is determined by the width of the spacers 16. It is, for example, 100 nm. At the end remote from the gate dielectric 12, the structure size of the gate electrode 22 is determined by the mask used during the structuring of the second electrode layer 21. The structure size in the upper region is, for example, 300 nm.

The planarizing layer 20 is subsequently etched back selectively with respect to the silicon substrate 11 and with respect to the gate electrode 22. This is done, for example, by means of isotropic etching using $NH_4$, HF. The MOS transistor is, if appropriate, completed by a second HDD implantation using, for example, arsenic at an energy of, for example, 90 keV and a dose of, for example, $5\times10^{15}$ $cm^2$. In addition, the source/drain regions and, if appropriate, the gate electrodes can be treated with silicide. These steps are not shown in detail.

Figure 10:
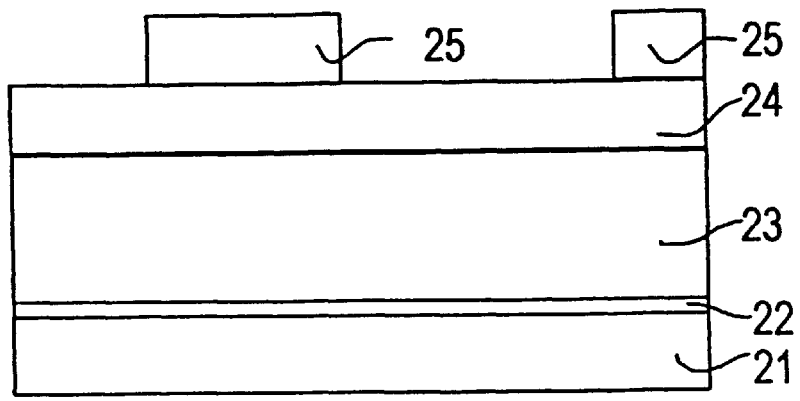
FIG. 10 shows a substrate with a gate dielectric, a first electrode layer, an auxiliary layer and a photoresist mask.

A gate dielectric 22 is applied to a substrate 21, which has silicon at least in the region of a main area, for example a monocrystalline silicon wafer or an SOI substrate. The gate dielectric 22 is formed, for example by thermal oxidation, from $SiO_2$ to a layer thickness of 3 to 4 nm (see FIG. 10).

A first electrode layer 23 made, for example, of doped polysilicon is applied to the gate dielectric 22 to a layer thickness of, for example, 400 nm. An auxiliary layer 24 made, for example, of $TEOS-SiO_2$ is deposited onto the first electrode layer 23 to a layer thickness of, for example, 200 nm. A photoresist mask 25 is produced on the auxiliary layer 24.

Figure 11:
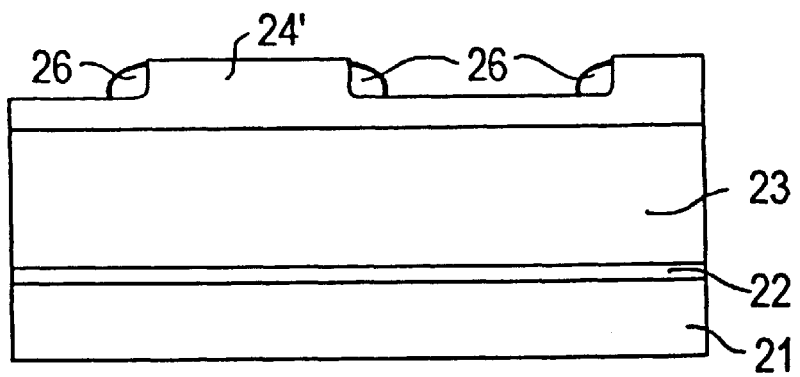
FIG. 11 shows the substrate following the formation of an auxiliary structure and the formation of spacers on flanks of the auxiliary structure.

An auxiliary structure 24' is formed from the auxiliary layer 24 by means of anisotropic etching, for example, using, for example, $CHF_3$ RIE (Reactive Ion Etching). The auxiliary structure 24' has vertical flanks. The auxiliary structure 24' completely covers the surface of the first electrode layer 23 (see FIG. 11). It has preferably regularly arranged elevations.

Polysilicon spacers 26 are formed on the flanks of the auxiliary structure 24' by depositing a polysilicon layer with essentially conformal edge covering to a thickness of, for example, 100 nm and anisotropically etching it back using, for example, HBr RIE (Reactive Ion Etching).

A hard mask 24" is formed by structuring the auxiliary layer 24' by means of anisotropic etching using, for example, $CHF_3$, $CF_4$ RIE (Reactive Ion Etching). The spacers 26 act as an etching mask in the process.

Figure 12:
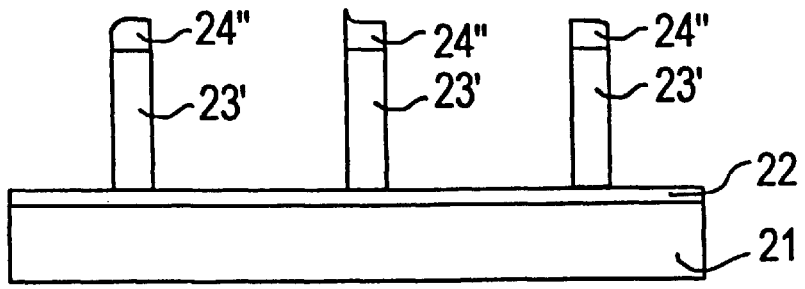
FIG. 12 shows the substrate following the structuring of the first electrode layer to form electrode webs.

The first electrode layer 23 is structured by means of anisotropic etching, for example, using, for example, HBr. This produces electrode webs 23', which are preferably arranged regularly (see FIG. 12). The polysilicon spacers 26 are removed during this etching process. Since the etching takes place selectively with respect to $SiO_2$, it stops on the surface of the hard mask 24" and of the gate dielectric 22.

Figure 13:
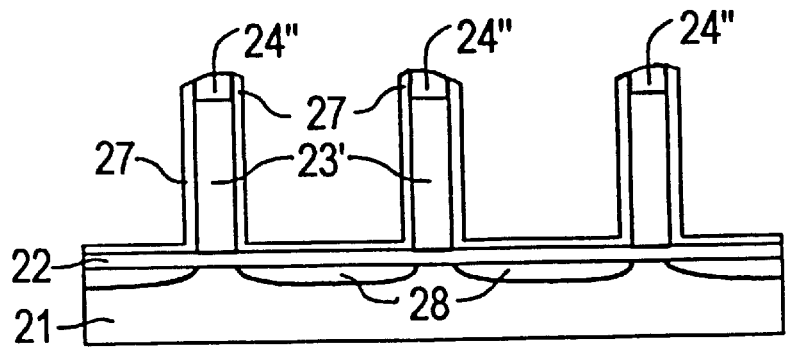
FIG. 13 shows the substrate following an LDD implantation.

If appropriate, $SiO_2$ spacers 27 for an LDD implantation 28 are produced on the flanks of the electrode webs 23'. The implantation is carried out, for example, using arsenic at an energy of, for example, 20 kev and a dose of $5\times10^{14}$ $cm^{-2}$ (see FIG. 13). The LDD doping can also be carried out by means of outdiffusion from doped spacers.

Figure 14:
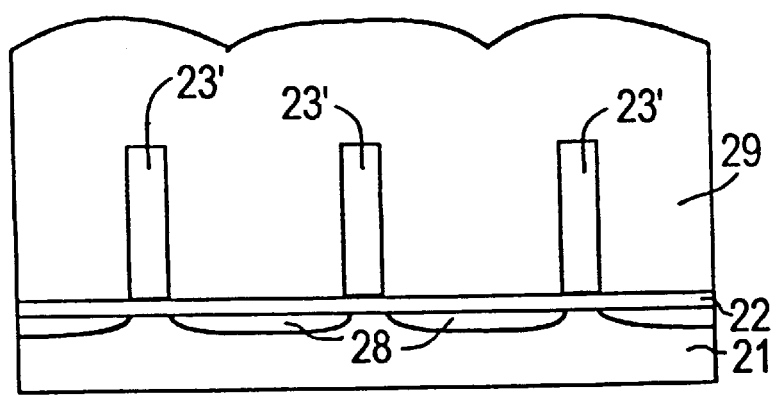
FIG. 14 shows the substrate following the deposition of an $SiO_2$ layer, which fills the interspaces between neighbouring electrode webs.

An $SiO_2$ layer is deposited over the whole area and fills the interspaces between neighbouring electrode webs 23'. In FIG. 14, the reference symbol 29 designates the $SiO_2$ layer, the hard mask 24", the $SiO_2$ spacers 27 (see FIG. 14). The $SiO_2$ layer has a thickness of, for example, 300 nm.

Figure 15:
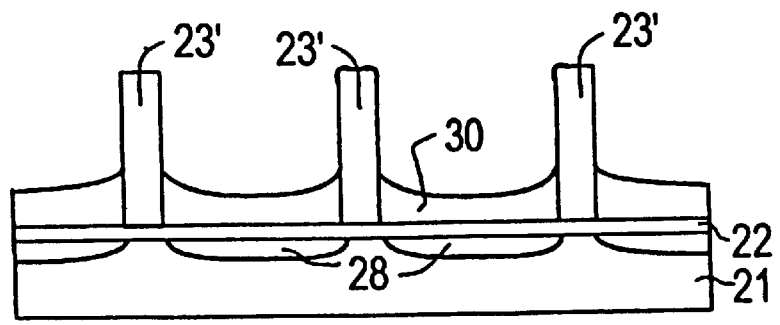
FIG. 15 shows the substrate following the planarization of the $SiO_2$ layer.

A planarizing layer 30 is formed from the $SiO_2$ layer 29 by planarization methods, for example chemical mechanical polishing or planarization etching. The regular arrangement of the electrode webs 23' is advantageous for the planarization, but is not absolutely necessary. The planarizing layer 30 has a smaller thickness than the first electrode layer 23. The planarizing layer 30 has a thickness of, for example, 100 nm (see FIG. 15). The electrode webs 23' have a height of, for example, 400 nm.

There is produced a mask 31, which covers a part of the electrode webs 23', which part is provided for a gate electrode to be produced later. Electrode webs 23" not covered by the mask 31 are etched back by means of wet-chemical etching using choline to the level of the planarizing layer 30 (see FIG. 16).

Figure 17:
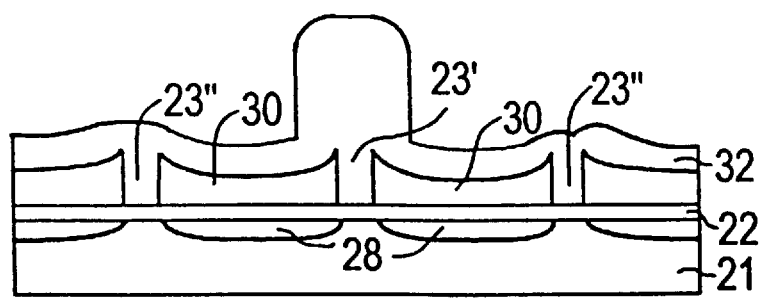
FIG. 17 shows the substrate following the deposition of a second electrode layer.

The removal of the mask 31 is followed by the deposition of a second electrode layer 32 over the whole area (see FIG. 17). The second electrode layer 32 is formed from doped polysilicon to a thickness of, for example, 100 nm. The second electrode layer 32 is joined to the electrode webs 23" and 23'.

Figure 18:
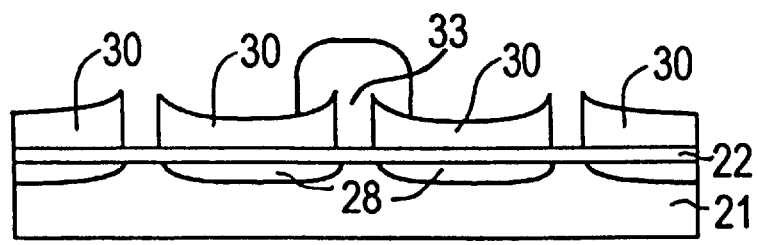
FIG. 18 shows the substrate following the etching back of the second electrode layer, the electrode webs not covered by the mask being completely removed and a gate electrode being formed in a self-aligned manner.
Figure 19:
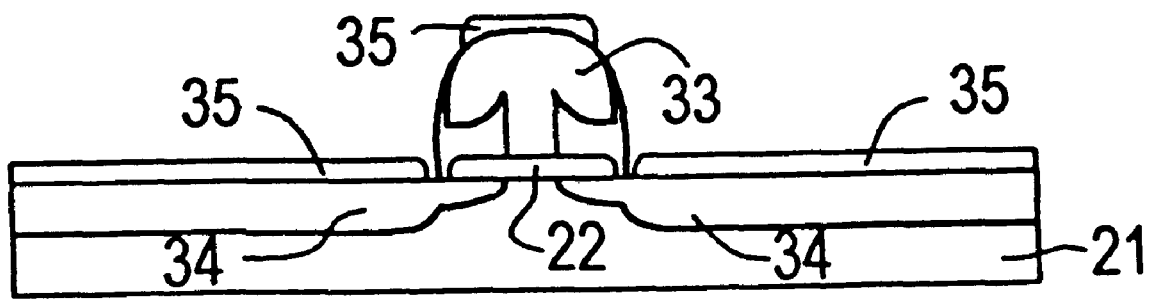
FIG. 19 shows the substrate following source/drain implantation and silicide formation on the surface of the source/drain regions and also of the gate electrode.

The second electrode layer 32 is etched back, as in a spacer etching, by means of anisotropic etching, for example, using HBr. At the same time, the electrode webs 23" which were not covered by the mask 31 are removed (see FIG. 18). Since that part of the electrode webs 23' which was covered by the mask 31 was not etched back to the level of the planarizing level 30, the structure has a distinctly larger height in this region. A gate electrode 33 therefore remains in this region during anisotropic etching back. The gate electrode 33 is composed of the part of the electrode webs 23' and that part of the second electrode layer 33 which is arranged thereabove.

For this self-aligned production of the gate electrode 33, it is important that the electrode webs 23' project distinctly beyond the planarizing layer 30. The electrode webs 23' project beyond the planarizing layer 30 by at least the thickness of the planarizing layer 30. The electrode webs 23' preferably have a ratio of the height to the base size of approximately 5:1. The ratio of the height of the electrode webs 23' to the thickness of the planarizing layer 30 is, for example, 4:1.

Figure 16:
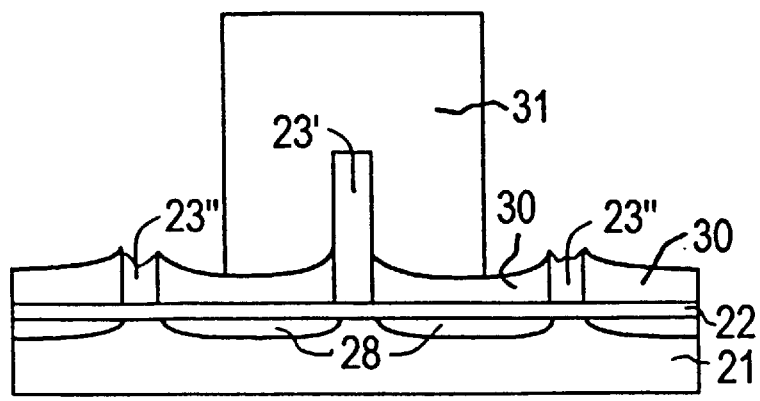
FIG. 16 shows the substrate with a mask which covers a part of the electrode webs, which part is provided as part of a gate electrode, and following the etching back of the electrode webs not covered by the mask.

As an alternative, in FIG. 16, the superfluous electrode webs 23" not covered by the mask 31 can be completely removed by wet-chemical means, and the resultant holes can, following the removal of the mask 31, be planarized by the deposition and etching back of, for example, 70 nm BPSG. Lower electrode webs 23' are then sufficient. A value of, for example, 3.5:1 instead of 5:1 is then sufficient in the exemplary embodiment for the ratio of the height to the base side of the electrode webs 23'.

The exposed part of the planarizing layer 30 and of the gate dielectric 22 is removed selectively with respect to silicon by means of anisotropic etching using, for example, $CHF_3$. The gate electrode 33 acts as a mask in the process.

The MOS transistor is completed by carrying out an HDD implantation, for example, using arsenic at an energy of, for example, 90 keV and a dose of, for example, $5 \times 10^{15}$ cm$^{-2}$. This forms source/drain regions 34, which also include the LDD regions 28. Finally, the surfaces of the source/drain regions 34 and of the gate electrode 33 are provided with a metal silicide layer 35 made, for example, of titanium silicide.

In both exemplary embodiments, the auxiliary structure 14' and 24' can also be formed by two partial layers. In this case, an $SiO_2$ layer is applied first and then an $Si_3N_4$ layer. During structuring, only the $Si_3N_4$ layer is structured selectively with respect to $SiO_2$.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for producing a MOS transistor, comprising the steps of:
   producing a source region, a drain region and a channel region arranged in between the source region and drain region in a substrate, which has silicon at least in the region of a main area;
   producing a gate dielectric, which covers at least a surface of the channel region, on the main area;
   producing a first electrode layer over a whole area of the main area;
   producing auxiliary structures having flanks which are aligned substantially perpendicular to the main area on the first electrode layer;
   forming spacers on the flanks of the auxiliary structures;
   structuring the first electrode layer in accordance with the spacers, electrode webs being produced thereby;
   forming a planarizing layer such that an upper region of the electrode webs perpendicular to the main area on the first electrode layer is exposed, interspaces between neighboring electrode webs being filled by the planarizing layer in a contiguous manner;
   producing a second electrode layer over the whole area; and
   forming, by structuring the second electrode layer, a gate electrode from a part of one of the electrode webs and a part of the second electrode layer.

2. The method according to claim 1,
   wherein an auxiliary layer is applied to the first electrode layer to form the auxiliary structures,
   wherein the auxiliary layer is structured by anisotropic etching such that the first electrode layer remains covered by the auxiliary layer and such that depressions having substantially vertical flanks are formed in the auxiliary layer.

3. The method according to claim 2,
   wherein the spacers on the flanks of the auxiliary structures are formed by deposition and anisotropic etching of a layer with substantially conformal edge covering,
   wherein a hard mask is formed by anisotropic etching of the auxiliary layer, using the spacers as an etching mask,
   wherein the electrode webs are formed by anisotropic etching of the first electrode layer, using the hard mask as an etching mask.

4. The method according to claim 1,
   wherein an insulating layer is deposited to form the planarizing layer, a thickness of the insulating layer being at least as large as half a distance between neighboring electrode webs,
   wherein the insulating layer is removed by a planarization method until the electrode webs are exposed in the upper region.

5. The method according to claim 1, wherein an LDD implantation is carried out following the formation of the electrode webs.

6. A method for producing a MOS transistor, comprising the steps of:
   producing a source region, a drain region and a channel region arranged in between the source region and drain region in a substrate, which has silicon at least in the region of a main area;
   producing a gate dielectric, which covers at least a surface of the channel region, on the main area;
   producing a first electrode layer over a whole area of the main area;
   producing auxiliary structures having flanks which are aligned substantially perpendicular to the main area on the first electrode layer;
   forming spacers on the flanks of the auxiliary structures;
   structuring the first electrode layer in accordance with the spacers, electrode webs being produced thereby;
   forming a planarizing layer such that an upper region of the electrode webs is exposed, interspaces between neighboring electrode webs being filled by the planarizing layer;
   producing a second electrode layer over the whole area;
   forming, by structuring the second electrode layer, a gate electrode from a part of one of the electrode webs and a part of the second electrode layer; and wherein the second electrode layer is structured using a lithographically produced mask.

7. A method for producing a MOS transistor, comprising the steps of:
   producing a source region, a drain region and a channel region arranged in between the source region and drain region in a substrate, which has silicon at least in the region of a main area;
   producing a gate dielectric, which covers at least a surface of the channel region, on the main area;
   producing a first electrode layer over a whole area of the main area;
   producing auxiliary structures having flanks which are aligned substantially perpendicular to the main area on the first electrode layer;
   forming spacers on the flanks of the auxiliary structures;
   structuring the first electrode layer in accordance with the spacers, electrode webs being produced thereby;
   forming a planarizing layer such that an upper region of the electrode webs is exposed, interspaces between neighboring electrode webs being filled by the planarizing layer;
   producing a second electrode layer over the whole area;
   forming, by structuring the second electrode layers a gate electrode from a part of one of the electrode webs and a part of the second electrode layer; and
   wherein the planarizing layer is formed such that the upper region of the electrode webs distinctly projects beyond the planarizing layer,
   wherein a mask is produced, which covers that part of the electrode webs which is provided as part of the gate electrode,
   wherein those parts of the electrode webs which are not covered by the mask are etched back,
   wherein the mask is removed,
   wherein anisotropic etching is carried out following the formation of the second electrode layer, during which anisotropic etching those parts of the electrode webs which are not covered by the mask are removed.

8. The method according to claim 7,
   wherein, following the formation of the gate electrode, the planarizing layer is structured by anisotropic etching, the gate electrode acting as a mask,
   wherein an implantation is carried out to form the source region and the drain region, the gate electrode acting as a mask,
   wherein the gate electrode and the source region and the drain region are provided with a layer made of metal silicide.

9. A method for producing a MOS transistor, comprising the steps of:
   producing a source region, a drain region and a channel region arranged in between the source region and drain region in a substrate, which has silicon at least in the region of a main area;
   producing a gate dielectric, which covers at least a surface of the channel region, on the main area;
   producing a first electrode layer over a whole area of the main area;
   producing auxiliary structures having flanks which are aligned substantially perpendicular to the main area on the first electrode layer;
   forming spacers on the flanks of the auxiliary structures;
   structuring the first electrode layer in accordance with the spacers, electrode webs being produced thereby;
   forming a planarizing layer such that an upper region of the electrode webs is exposed, interspaces between neighboring electrode webs being filled by the planarizing layer;
   producing a second electrode layer over the whole area;
   forming, by structuring the second electrode layer, a gate electrode from a part of one of the electrode webs and a part of the second electrode layer; and
   wherein the first electrode layer and the second electrode layer and also the spacers made of doped polysilicon, the auxiliary structures and the planarizing layer are formed from SiO2.

10. A method for producing a MOS transistor, comprising the steps of:
    producing a source region, a drain region and a channel region arranged in between the source region and drain region in a substrate, which has silicon at least in the region of a main area;
    producing a gate dielectric, which covers at least a surface of the channel region, on the main area;
    producing a first electrode layer over a whole area of the main area, producing auxiliary structures having flanks which are aligned substantially perpendicular to the main area on the first electrode layer;
    forming spacers on the flanks of the auxiliary structures;
    structuring the first electrode layer in accordance with the spacers, electrode webs being produced thereby;
    forming a planarizing layer over the whole area of the main area, entirely covering the electrode webs, such that a minimum depth of the planarizing layer is greater than a maximum height of the electrode webs;
    removing the planarizing layer until its thickness is less than the height of the electrode webs yet is great enough to contiguously fill interspaces between neighboring electrode webs;
    producing a second electrode layer over the whole area of the main area covering both the electrode webs and the planarizing layer remaining from the step of removing the planarizing layer; and
    removing portions of the second electrode layer, thereby forming gate electrodes, each respective gate electrode being formed from a part of one of the electrode webs and a part of the second electrode layer, the second layer being above and directly on top of the electrode web in a direction away from the substrate, the width of each electrode web being smaller than the width of each remaining portion of the second electrode layer on top of the respective electrode web.

* * * * *